(12) United States Patent
Favennec et al.

(10) Patent No.: US 9,087,872 B2
(45) Date of Patent: Jul. 21, 2015

(54) METHOD FOR FORMING AN INSULATING TRENCH IN A SEMICONDUCTOR SUBSTRATE AND STRUCTURE, ESPECIALLY CMOS IMAGE SENSOR, OBTAINED BY SAID METHOD

(71) Applicant: STMicroelectronics (Crolles 2) SAS, Crolles (FR)

(72) Inventors: Laurent Favennec, Villard Bonnot (FR); Arnaud Tournier, Grenoble (FR); François Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/168,167

(22) Filed: Jan. 30, 2014

(65) Prior Publication Data

US 2014/0145251 A1    May 29, 2014

Related U.S. Application Data

(63) Continuation-in-part of application No. 13/560,413, filed on Jul. 27, 2012, now abandoned.

(30) Foreign Application Priority Data

Jul. 27, 2011   (FR) ...................... 11 56861

(51) Int. Cl.
*H01L 21/762*   (2006.01)
*H01L 27/146*   (2006.01)

(52) U.S. Cl.
CPC .... *H01L 21/76224* (2013.01); *H01L 21/76237* (2013.01); *H01L 27/1463* (2013.01)

(58) Field of Classification Search
CPC ................. H01L 21/76224; H01L 21/76237; H01L 27/1463; H01L 21/762
USPC .......................................... 438/437; 257/291
See application file for complete search history.

(56) References Cited

U.S. PATENT DOCUMENTS

| | | | | |
|---|---|---|---|---|
| 4,666,557 | A | * | 5/1987 | Collins et al. ............... 438/434 |
| 5,994,209 | A | * | 11/1999 | Yieh et al. .................... 438/541 |
| 2004/0106261 | A1 | | 6/2004 | Huotari et al. |
| 2004/0251513 | A1 | | 12/2004 | Su et al. |
| 2004/0262641 | A1 | | 12/2004 | Rhodes |
| 2007/0105336 | A1 | * | 5/2007 | Takeoka et al. ............... 438/424 |
| 2008/0277726 | A1 | | 11/2008 | Doris et al. |

(Continued)

FOREIGN PATENT DOCUMENTS

WO    WO 2011/036841    3/2011

OTHER PUBLICATIONS

French Search Report and Written Opinion dated Oct. 12, 2011 from French Application No. 11/55248.

(Continued)

*Primary Examiner* — William F Kraig
*Assistant Examiner* — Pavel Ivanov
(74) *Attorney, Agent, or Firm* — Seed IP Law Group PLLC

(57) ABSTRACT

A structure comprising at least one DTI-type insulating trench in a substrate, the trench being at the periphery of at least one active area of the substrate forming a pixel, the insulating trench including a cavity filled with a dielectric material, the internal walls of the cavity being covered with a layer made of a boron-doped material.

8 Claims, 1 Drawing Sheet

(56) References Cited

U.S. PATENT DOCUMENTS

| | | |
|---|---|---|
| 2008/0315288 A1 | 12/2008 | Kikuchi et al. |
| 2009/0224329 A1 | 9/2009 | Goto |
| 2010/0148230 A1* | 6/2010 | Stevens et al. ............. 257/290 |
| 2013/0026546 A1 | 1/2013 | Favennec et al. |
| 2013/0113061 A1* | 5/2013 | Lai et al. ............. 257/432 |

OTHER PUBLICATIONS

French Search Report and Written Opinion dated Nov. 23, 2011 from corresponding French Application No. 11/56861.

* cited by examiner

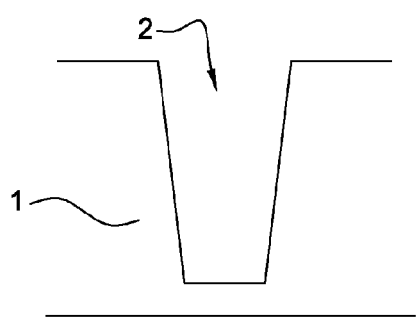
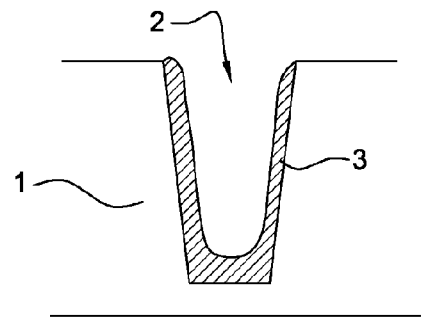
Fig. 1   Fig. 2
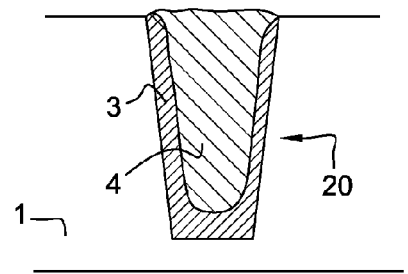
Fig. 3
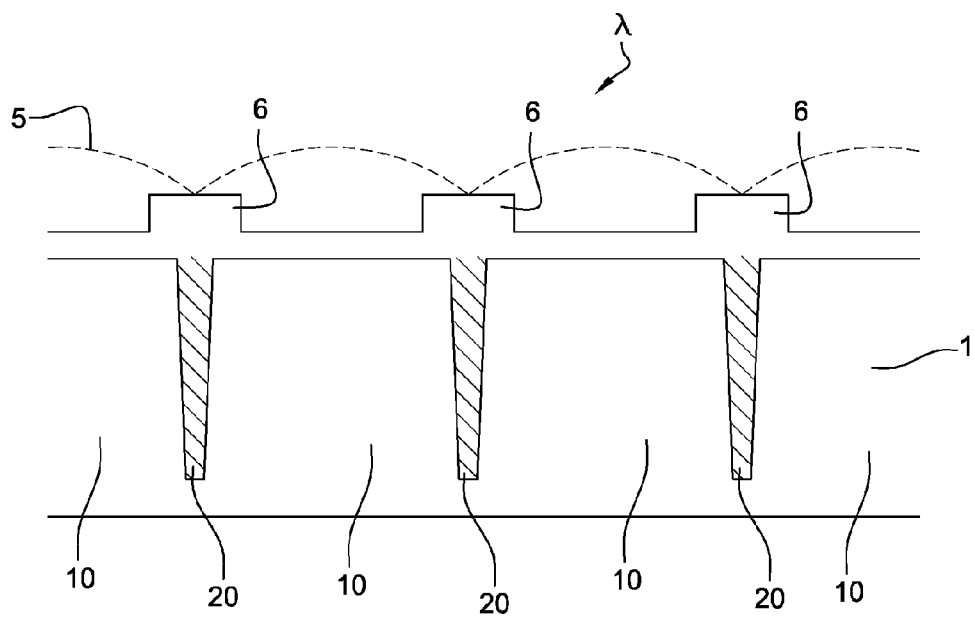
Fig. 4

METHOD FOR FORMING AN INSULATING TRENCH IN A SEMICONDUCTOR SUBSTRATE AND STRUCTURE, ESPECIALLY CMOS IMAGE SENSOR, OBTAINED BY SAID METHOD

CROSS REFERENCE TO RELATED APPLICATIONS

This application is a continuation-in-part patent application of U.S. application Ser. No. 13/560,413, filed Jul. 27, 2012, which application claims the priority benefit of French Patent Application Number 11/56861, filed on Jul. 27, 2011, entitled INTEGRATED CIRCUIT COMPRISING AN ISOLATING TRENCH AND CORRESPONDING METHOD, which applications are hereby incorporated by reference to the maximum extent allowable by law.

TECHNICAL FIELD

The present disclosure relates to microelectronics. It more specifically relates to an improvement relative to insulating trenches, such as DTI (Deep Trench Isolation) trenches.

DISCUSSION OF THE RELATED ART

Generally, active areas are provided in a substrate for component or electric circuit forming purposes. Further, to electrically insulate an active area from another neighboring active area, insulation areas are formed of insulating trench type in this substrate. Such trenches generally are cavities etched in the substrate and filled with a dielectric material, such as a material made of oxide, for example, silicon dioxide.

In the specific case of image sensors, or photodetectors, the substrate, which is generally made of silicon, especially comprises an array of active areas, each forming a pixel, each active area being, in particular, capable of converting the incident received light photons into electric signals. Each active area generally is in front of a filter capable of only letting through photons having a specific wavelength, thus defining the color associated with the corresponding active area. The substrate further comprises insulating trenches which separate the active areas from one another to avoid any charge migration from an active area to another neighboring active area. Each insulating trench is especially filled with a dielectric material made of oxide, for example, silicon dioxide.

However, the existence of imperfections at the interface between the substrate and the trench thus filled induces the appearing of charges, especially in the absence of any light source, and thus the generation of a parasitic current commonly called "Idark" or dark current. Depending on its intensity, this parasitic current may be taken into account by the processing circuits, thus providing false information as to the light effectively received by the image sensor.

To decrease such imperfections, it is possible to modify the internal surfaces of the trench before filling thereof, by a surface processing method. It is also possible to perform a p-type dopant ion implantation. However, the ion implantation process is complex, and hardly capable of providing a homogeneous implantation of the dopants at the substrate/trench interface. It is further necessary to control the method, to avoid introducing too many dopants at the substrate level, which would risk modifying the characteristics of the active areas.

SUMMARY

In such a context, the present disclosure especially aims at providing a new method for forming insulating trenches, for example, DTI-type insulating trenches, which enables to decrease or even to eliminate dark currents.

For this purpose, an embodiment provides a method for forming a DTI-type insulating trench in a substrate, comprising at least: forming a cavity in the substrate, at the periphery of at least one active area of the substrate, said active area forming a pixel of a CMOS-type image sensor; conformally depositing a so-called passivation layer, on the internal walls of the cavity, said layer being made of a boron-doped insulating material; filling the volume remaining in the cavity with a dielectric material; and annealing the structure thus formed.

In other words, the internal walls of the cavity are first lined with a layer of a boron-doped insulating material, for example, made of boron-doped oxide, after which the remaining cavity volume is filled with a non-doped dielectric material, and the structure thus obtained is finally annealed to promote the diffusion of dopants towards the substrate and towards the non-doped dielectric material.

The layer deposition of dopants together with the position of the anneal in this succession of steps provide a controlled diffusion of boron atoms around the substrate/insulating trench interface. The defects located around the substrate/insulating trench interface are thus totally or partly neutralized.

The substrate/insulating trench interface is especially formed by the cavity wall. Preferentially, during the anneal, boron atoms diffuse as far as a 0.2-μm distance on either side of the substrate/insulating trench interface.

In practice, the passivation layer may be made of boron-doped silicon oxide.

Advantageously, the boron-doped material comprises from 0.5 to 6% of boron by mass.

In an embodiment, the barrier layer may have a thickness smaller than or equal to 300 nanometers.

In practice, at a given temperature, the boron atom diffusion coefficient depends on the material used. For example, boron atom diffusion coefficients in silicon and in oxide are different. Therefore, to limit the dopant diffusion beyond the interface, the thickness of the insulating layer and the dopant mass in the insulating material are preferentially selected by taking into account the boron atom segregation coefficient at the interface, as well as of the boron diffusion coefficients in the substrate material and in the dielectric material. The segregation controls imposes the boron concentration ratio on either side of the interface, and the diffusion coefficients controls the extension of the boron profile on either side of the interface.

According to an alternative embodiment, the barrier layer may be deposited by chemical vapor deposition.

In a specific execution mode, the deposition is performed in the following conditions:
temperature: from 400 to 550° C.;
pressure: from 200 to 650 Torrs;
speed: from 5 to 50 nm/min.

In a specific embodiment, the anneal is performed in the following conditions:
anneal temperature: from 850 to 1,050° C.;
anneal time: from 20 to 120 minutes.

Another embodiment provides a structure comprising at least one DTI-type insulating trench in a substrate, for example formed according to the above-discussed method, said trench being at the periphery of at least one active area of the substrate, said active area forming a pixel of a CMOS-type image sensor, the insulating trench comprising a cavity filled with a dielectric material, the internal walls of said cavity being covered with a layer made of a boron-doped insulating material.

Another embodiment provides a CMOS-type image sensor comprising at least:

a substrate comprising an array of active areas and at least one insulating trench for example formed according to the above-discussed method, each active area being capable of converting an incident photon into an electric signal, each insulating trench laterally separating an active area from another neighboring active area; and an array of filters, each filter being in front of one of the active areas and being capable of selecting photons of a predefined wavelength.

The foregoing and other features and advantages of the embodiments will be discussed in detail in the following non-limiting description of specific embodiments in connection with the accompanying drawings.

BRIEF DESCRIPTION OF THE DRAWINGS

FIGS. 1 to 3 are simplified cross-section views of an insulating trench according to an embodiment; and FIG. 4 is a partial cross-section view of a simplified representation of an image sensor according to an embodiment.

DETAILED DESCRIPTION

The method for forming an insulating trench in a substrate especially comprises: the forming (FIG. 1) of a cavity 2 in substrate 1;

the conformal deposition (FIG. 2) of a layer 3 on the internal walls of cavity 2, layer 3 being made of a boron-doped insulating material;

the filling (FIG. 3) of the volume remaining in cavity 2 with a dielectric material 4; and the annealing of the structure thus formed.

Thus, instead of performing a complex p-type dopant ion implantation at the substrate/trench interface, so-called "passivation" layer 3 is conformally deposited on the internal walls of cavity 2, after which this cavity 2 is filled with dielectric material 4. "Passivation" means that this layer contributes to neutralizing the defects which create in the silicon substrate at the time of the etching, or which are naturally present in the substrate. An anneal then enables all or part of the boron atoms contained in barrier layer 3 to diffuse and to fill all or part of the gaps which may have formed around the substrate/insulating trench interface [in the substrate 1]. Indeed, the simple deposition of the boron-doped material in the cavity by a growth technique such as epitaxy appears not to totally induce the phenomenon of gap passivation with boron. The anneal step enables to induce the diffusion of boron atoms towards the substrate and towards the non-doped dielectric material.

The structure thus formed after anneal comprises an insulating trench 20 in a substrate 1, this trench being formed of a cavity 2 filled with a dielectric material 4, and its internal walls being covered with a layer 3 of a boron-doped material. In other words, layer 3 is interposed between substrate 1 and dielectric material 4.

Substrate 1 may especially be made of silicon, and dielectric material 4 may be made of oxide, for example, of silicon dioxide.

The maximum depth of cavity 2 may be greater than or equal to 6 microns, especially approximately ranging from 2 microns to 8 microns, for example, substantially equal to 4 microns.

The deposition of layer 3 may especially be carried out by chemical vapor deposition (CVD). For example, a low-pressure chemical vapor deposition (LPCVD) or a sub-atmospheric pressure chemical vapor deposition (SACVD), or any deposition technique adapted to filling the cavity with the boron-doped material may be used.

The boron-doped material is preferably boron-doped silicon oxide or BSG ("boro-silicate glass"), especially comprising between 0.5 and 6% of boron by mass. The thickness of layer 3 is preferably smaller than 300 nm, especially approximately ranging between 10 nm and 200 nm, for example, substantially close to 40 nm.

The CVD deposition of BSG layer 3 may be performed in the following conditions:

temperature: from 400 to 550° C.;
pressure: from 200 to 650 Torrs;
speed: from 5 to 50 nm/min;
precursor: TEOS (for "Tetra-Ethyl-Ortho-Silicate"), or TMB (for "Trimethyl Borate"), or ozone, or oxygen, or water, possibly with an additive such as HMDS (for Hexamethyldisilazane) or HMDSO (for Hexamethyldisiloxane).

The filling of cavity 2 with dielectric material 4 may also be performed by CVD, and may especially be performed in the following conditions:

temperature: from 500 to 550° C.;
pressure: from 500 to 650 Torrs;
speed: from 2 to 20 nm/min;
precursor: TEOS, or TMB, or ozone, or oxygen, or water, possibly with an additive such as HMDS or HMDSO.

The anneal may especially be performed in the following conditions:

anneal temperature: from 850 to 1,050° C.;
anneal time: from 20 to 120 minutes;
precursor: inert gas or oxygen.

The forming of such an insulating trench is especially advantageous in the case of image sensors. Such an image sensor is illustrated in FIG. 4 and especially comprises an array of active areas 10 formed in substrate 1. Each active area 10 is especially capable of converting an incident photon λ into an electric signal, and each active area 10 is laterally separated from another neighboring active area 10 by an insulating trench 20 such as described hereabove. Further, each active area 10 is in front of a filter 5 capable of only letting through photons of a specific wavelength.

It can especially be observed that for such an image sensor, the dark current (Idark) is divided by a factor on the order of four with respect to the dark current of an image sensor integrating conventional insulating trenches.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method comprising:
   forming a cavity in a substrate, at a periphery of at least one active area of the substrate, said active area forming a pixel of a CMOS-type image sensor, the cavity having internal walls;

conformally depositing a layer on the internal walls of the cavity, with a volume of the cavity remaining unfilled, said layer being made of a boron-doped insulating material;

filling the volume remaining in the cavity with a dielectric material to form an insulating trench, the insulating trench including the conformally deposited layer and the dielectric layer; and annealing the insulating trench.

2. The method of claim 1, wherein the layer is made of boron-doped silicon oxide.

3. The method of claim 1, wherein the boron-doped material comprises from 0.5 to 6% of boron by mass.

4. The method of claim 1, wherein the layer has a thickness smaller than or equal to 300 nanometers.

5. The method of claim 1, wherein conformally depositing comprises depositing the layer by chemical vapor deposition.

6. The method of claim 5, wherein the deposition is performed in the following conditions:
- temperature: from 400 to 550° C.;
- pressure: from 200 to 650 Torrs;
- speed: from 5 to 50 nm/min.

7. The method of claim 1, wherein annealing comprises annealing in the following conditions:
- anneal temperature: from 850 to 1,050° C.;
- anneal time: from 20 to 120 minutes.

8. The method of claim 1, wherein the insulating trench is a DTI-type insulating trench.

* * * * *